US008466671B2

(12) United States Patent
Worones

(10) Patent No.: US 8,466,671 B2
(45) Date of Patent: Jun. 18, 2013

(54) DIGITAL MULTIMETER HAVING A CASE AND A SEPARATE PANEL STRUCTURE

(75) Inventor: Jeffrey E. Worones, Seattle, WA (US)

(73) Assignee: Fluke Corporation, Everett, WA (US)

( * ) Notice: Subject to any disclaimer, the term of this patent is extended or adjusted under 35 U.S.C. 154(b) by 83 days.

(21) Appl. No.: 13/031,438

(22) Filed: Feb. 21, 2011

(65) Prior Publication Data

US 2011/0140687 A1   Jun. 16, 2011

Related U.S. Application Data

(62) Division of application No. 11/893,122, filed on Aug. 14, 2007, now Pat. No. 7,911,200.

(51) Int. Cl.
*G01R 1/04* (2006.01)

(52) U.S. Cl.
USPC ............................................. 324/156

(58) Field of Classification Search
USPC ................................. 324/156, 115
See application file for complete search history.

(56) References Cited

U.S. PATENT DOCUMENTS

| 2,509,415 | A |   | 5/1950 | Bernrenter |
|---|---|---|---|---|
| 4,103,132 | A |   | 7/1978 | Schwarzkopf |
| 4,951,834 | A | * | 8/1990 | Aikins ........................... 220/614 |
| 5,084,670 | A |   | 1/1992 | Melenotte |
| 5,218,290 | A |   | 6/1993 | Beckert et al. |
| 5,621,311 | A |   | 4/1997 | Kamiya |
| 5,625,286 | A |   | 4/1997 | Kamiya |
| 5,834,935 | A | * | 11/1998 | Lyford .......................... 324/156 |
| 5,923,161 | A |   | 7/1999 | Frankovitch, Jr. et al. |
| 6,043,640 | A |   | 3/2000 | Lauby et al. |
| 6,218,824 | B1 |   | 4/2001 | Oldstead et al. |
| 6,466,003 | B1 |   | 10/2002 | Gallavan et al. |
| 7,034,517 | B2 |   | 4/2006 | Newcombe |
| 7,654,857 | B2 |   | 2/2010 | Morey et al. |
| 7,830,135 | B2 |   | 11/2010 | Worones et al. |
| 2003/0078014 | A1 |   | 4/2003 | Salminen et al. |

(Continued)

FOREIGN PATENT DOCUMENTS

DE   3330587 A1   3/1985
DE   3512077 A1   10/1985

(Continued)

OTHER PUBLICATIONS

English Translation of Office Action Issued by the German Patent Office dated Jun. 20, 2011 regarding corresponding German Application No. 102008034535.0.

(Continued)

*Primary Examiner* — Jay Patidar
(74) *Attorney, Agent, or Firm* — Nelson, Mullins, Riley & Scarborough LLP

(57) ABSTRACT

A multimeter includes a case defining an interior cavity in which components of the multimeter are located. The case has a top portion defining a plurality of first button apertures. A rotary selector knob is also provided for selecting a multimeter function. The multimeter further includes a separate front panel juxtaposed to the top portion of the case. The front panel has a plurality of second button apertures in respective register with at least some of the first button apertures. The top portion of the case may define a recess in which the front panel is received. The multimeter may also include a flexible keypad located between the top portion of the case and the front panel.

12 Claims, 4 Drawing Sheets

U.S. PATENT DOCUMENTS

| | | |
|---|---|---|
| 2006/0175566 A1 | 8/2006 | Albizuri |
| 2009/0045038 A1 | 2/2009 | Worones et al. |
| 2009/0102455 A1 | 4/2009 | Worones |

FOREIGN PATENT DOCUMENTS

| | | |
|---|---|---|
| DE | 69025641 T2 | 7/1996 |
| EP | 0715491 A3 | 4/1998 |
| EP | 0866509 A3 | 7/1999 |
| FR | 2562241 A1 | 10/1985 |
| FR | 2813143 A1 | 2/2002 |
| TW | I243574 B | 11/2005 |

OTHER PUBLICATIONS

English Translation of First Office Action Issued by the Chinese Patent Office dated Mar. 29, 2011 regarding corresponding Chinese Application No. 200810099540.4.

U.K. Intellectual Property Office Search Report dated Jul. 18, 2008 for corresponding U.K. Application No. GB0806372.9.

Fluke Users manual—Model 187 & 189 True RMS Multimeter, Aug. 2000, Rev. 2, Jun. 2002.

Patent Examination Report for corresponding British application No. GB0806372.9 mailed Oct. 10, 2011.

Patent Examination Report for corresponding British application No. GB1202257.0 mailed Mar. 12, 2012.

Second Office Action from corresponding Chinese application No. 200810099540.4 mailed Mar. 31, 2012.

Search Report and Written Opinion of corresponding French application No. FR0855251 mailed Jun. 19, 2012.

Third Office Action from corresponding Chinese application No. 200810099540.4 mailed Aug. 30, 2012.

Office Action from corresponding Taiwanese application No. 097111509, mailed Sep. 12, 2012.

\* cited by examiner

DIGITAL MULTIMETER HAVING A CASE AND A SEPARATE PANEL STRUCTURE

CROSS-REFERENCE TO A RELATED APPLICATION

This is a divisional of copending application Ser. No. 11/893,122 filed Aug. 14, 2007, now pending, which is relied upon and incorporated herein by reference for all purposes.

BACKGROUND OF THE INVENTION

The present invention relates generally to digital multimeters. More particularly, the invention relates to a digital multimeter having an improved structure for the front of the meter case.

Digital multimeters (DMMs) function to measure a number of electrical parameters generally needed for service, troubleshooting and maintenance. Such parameters may include AC voltage and current, DC voltage and current, resistance and continuity. In some cases, a DMM may measure other parameters such as capacitance and temperature.

A DMM will often be configured as a hand-held unit having a rotary selector knob by which the various functions are selected. A plurality of lead jacks are provided in the case (i.e., housing) of the unit for connection of test leads. The specific jack used may depend on the function that has been selected. An LCD display provides a reading of the tested parameter.

A particular manufacturer may offer several different models in its DMM product line for users having different needs. In this regard, a DMM model at the lower end of the product line may offer fewer functions or features than a DMM at the higher end of the product line. For example, the selector knob in the lower-end unit may have five positions whereas the selector knob in the higher end unit may have ten positions. In the past, each such DMM has been assembled using its own molded case. This has created various difficulties in the assembly process.

Details regarding the construction and operation of multimeters may be discerned from U.S. Pat. Nos. 7,034,517, 6,466,003 and 6,043,640, incorporated herein by reference.

SUMMARY OF THE INVENTION

According to one aspect, the present invention provides a multimeter comprising a case defining an interior cavity in which components of the multimeter are located. The case has a top portion defining a plurality of first button apertures. A rotary selector knob for selecting a multimeter function is also provided. The multimeter further includes a separate front panel juxtaposed to the top portion of the case. The front panel has a plurality of second button apertures in respective register with at least some of the first button apertures. The top portion of the case may define a recess in which the front panel is received.

In some presently preferred embodiments, the front panel includes a stop feature to limit rotational movement of the rotary selector knob. Often, the stop feature may include an arcuate groove defined in the front panel. In addition, the selector knob may have a depending protrusion received in the arcuate groove.

Exemplary embodiments are contemplated in which the case is formed of top and bottom case members which together define the interior cavity. The top case member may be constructed having a unitary molding of transparent polymeric material overmolded with a softer polymeric material. The unitary molding in such embodiments may define the plurality of first button apertures. In addition, the unitary molding preferably provides a display window in such embodiments.

In many embodiments, the top portion of the case may define a greater number of first button apertures than the number of second button apertures defined in the front panel. A flexible keypad having a plurality of key buttons is preferably located between the top portion of the case and the front panel. In such embodiments, the key buttons will extend through respective second button apertures. Moreover, an O-ring seal may be located about a shaft of the selector knob between the top portion of the case and the front panel.

An additional aspect of the present invention is provided by a method of assembling a case of a digital multimeter. One step of the method involves providing top and bottom case members which define an interior cavity when assembled. The top case member has a panel recess defining a first number of first button apertures. According to another step, a first front panel configured to be received in the panel recess is provided. The first front panel defines a second number of second button apertures. Another step involves providing a second front panel configured to be received in the panel recess. The second front panel defines a third number of third button apertures, the third number being different from the second number. The case is then assembled with the first front panel.

Preferably, the first and second front panels will each define respective first and second arcuate grooves to limit rotation of a rotary selector knob. The second arcuate groove has a different angular extent than the first arcuate groove.

According to another aspect, the present invention provides a method of assembling a case of a digital multimeter. One step of the method involves providing top and bottom case elements which define an interior cavity when assembled. The top case element has a panel recess defining a first shaft aperture for receipt of a shaft of a selector knob. Another step involves providing a first front panel configured to be received in the panel recess. The first front panel defines a second shaft aperture and a first arcuate groove to limit rotation of the selector knob.

A second front panel configured to be received in the panel recess is also provided. The second front panel has a third shaft aperture and a second arcuate groove to limit rotation of the selector knob. The second arcuate groove has a different angular extent than the first arcuate groove. The case is then assembled with the first front panel such that the second shaft aperture is in register with the first shaft aperture.

In a still further aspect, the present invention provides a multimeter comprising a case defining an interior cavity in which components of the multimeter are located. The case has a top portion defining a first shaft aperture. A separate front panel juxtaposed to the top portion of the case is also provided. The front panel defines a second shaft aperture in register with the first shaft aperture. The multimeter further includes a rotary selector knob for selecting a multimeter function. The selector knob is operative to rotate a shaft extending through the first and second shaft apertures. An arcuate groove is defined in the front panel to limit rotation of the selector knob. Preferably, the selector knob has a depending protrusion received in the arcuate groove.

According to another aspect, the present invention provides a multimeter comprising a case defining an interior cavity in which components of the multimeter are located. The case has a top portion defining a panel receiving recess. A separate front panel is located in the panel receiving recess, the front panel defining a plurality of button apertures. A flexible keypad is located between the top portion of the case and the front panel. The keypad has a plurality of key buttons extending through respective button apertures in the front panel.

Other objects, features and aspects of the present invention are provided by various combinations and subcombinations of the disclosed elements, as well as methods of practicing same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
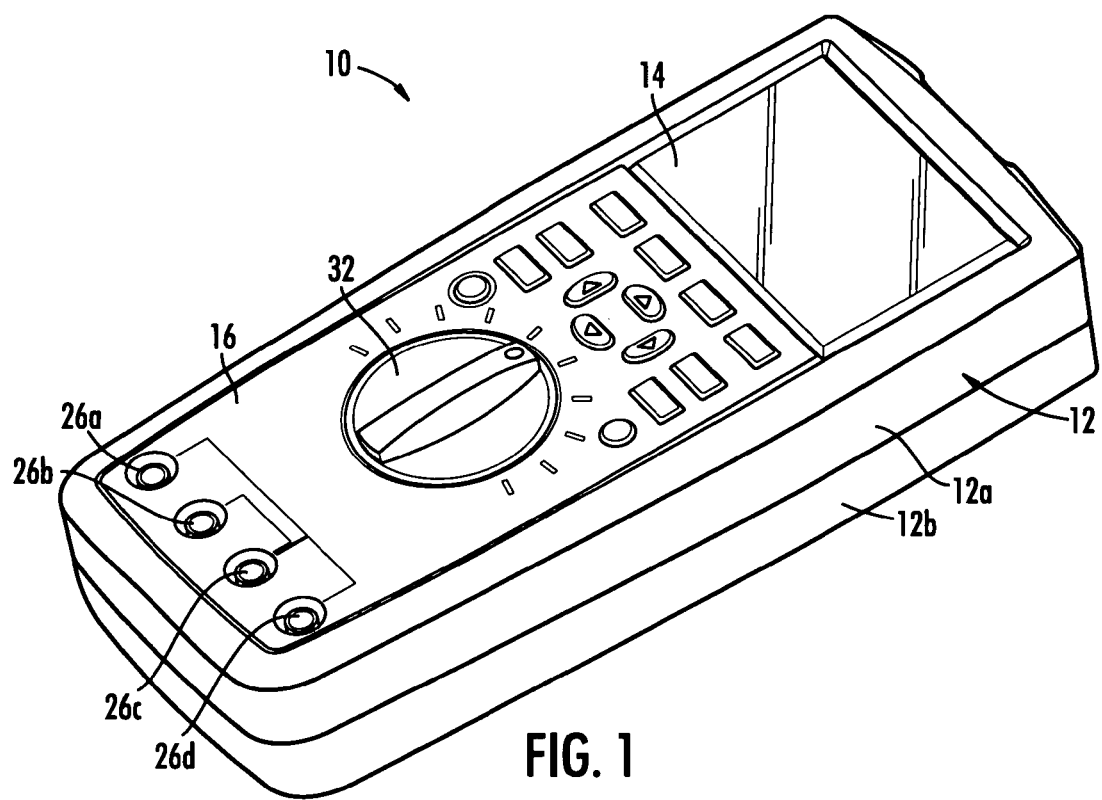
FIG. 1 is a perspective view of a digital multimeter constructed in accordance with the present invention.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary constructions.

FIG. 1 illustrates a digital multimeter (DMM) 10 constructed in accordance with the present invention. Multimeter 10 comprises a housing in the form of a case 12 defining an interior cavity in which various internal components are located. In this embodiment, case 12 is preferably formed having top and bottom case members 12a and 12b which together define the interior cavity. Preferably, each of the case members 12a and 12b may be formed of a molded shell of high impact rigid plastic which is at least partially overmolded with a softer polymeric material. The softer material provides a desirable gripping surface. The molded shell of the bottom case member may be opaque, whereas embodiments are contemplated in which the molded shell of the top case member is transparent. The transparent material provides a window 14 through which a suitable display, such as a liquid crystal display (LCD), can be viewed.

Figure 2:
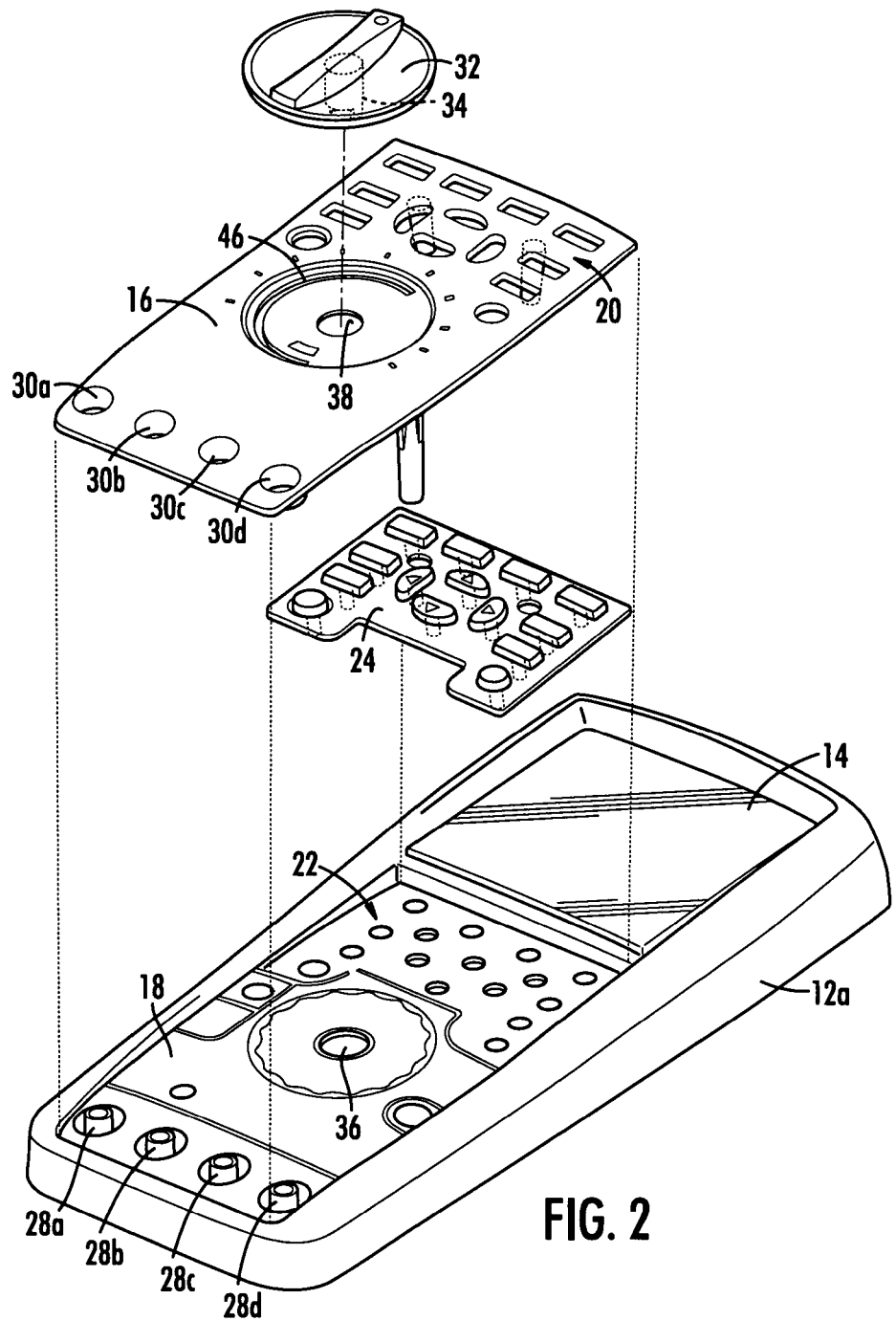
FIG. 2 is perspective view showing the front panel and certain other parts separated from the top case member for purposes of illustration.

Referring now also to FIG. 2, a separate front panel (or "skin") 16 is received in a corresponding recess 18 defined in case member 12a. Panel 16, which is preferably formed of a rigid polymeric material, defines various apertures and other features necessary for a particular multimeter model. Other multimeter models may be assembled using the same basic case, but with a different front panel. Suitable graphics will typically be printed on the front surface of the panel for the particular model of multimeter to which the panel corresponds. If case member 12a is transparent in the area of recess 18, panel 16 may render the overall assembly desirably opaque in this area.

In this embodiment, for example, panel 16 defines a total of fourteen apertures (collectively indicated at 20) through which the heads of respective keys (buttons) extend. Each of the keys has a respective post that extends through a corresponding aperture (collectively 22) in top case member 12a. In presently preferred embodiments, pressing a key causes the associated post to contact the multimeter's printed circuit board (located inside the case). The posts may have a layer of conductive ink at their respective distal ends which closes a connection across terminals on the surface of the circuit board.

In this case, the set of keys is provided by a single flexible keypad 24 sandwiched between case member 12a and panel 16. The keys themselves are positioned to extend through apertures 20, whereas their respective posts extend through apertures 22. As shown, these keys may include directional navigation buttons as well as other buttons for selecting particular functions or parameters.

Referring again to FIG. 1, a plurality of jacks 26a-d are also provided for connection of respective test leads. The jacks are preferably formed by embedding conductive sockets 28a-d into top case member 12a during the molding process. Corresponding apertures 30a-d are defined in panel 16 for allowing access to the respective sockets.

Figure 3:
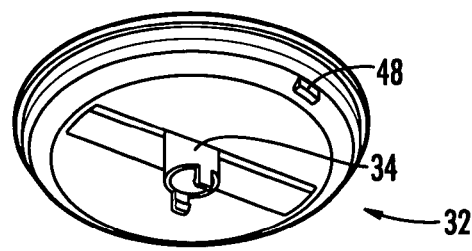
FIG. 3 is a perspective view showing the underside of the rotary selector knob.
Figure 6:
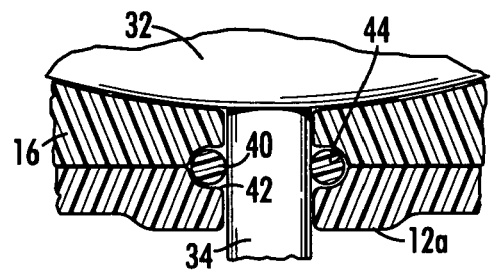
FIG. 6 is an enlarged view in partial cross-section showing an O-ring seal located around the shaft of the selector knob.

A rotary selector knob 32 allows the user to select a particular multimeter function. In the model shown in FIG. 1, ten such functions are indicated by respective stop positions in the knob rotation. Selector knob 32 includes a shaft 34 (see FIG. 3) that extends into the interior of case 12. In this regard, top case member 12a and panel 16 define respective apertures 36 and 38 for receipt of shaft 34. As shown in FIG. 6, an elastomeric O-ring 40 may be located around shaft 34 to inhibit moisture penetration into the case. Respective halves 42 and 44 of the O-ring seating groove may desirably be defined in top case member 12a and panel 16, as shown.

Shaft 34 connects selector knob 32 to a rotary switch assembly mounted to the interior circuit board. Preferably, a suitable detent mechanism divides rotation of selector knob 32 into discrete increments. As a result, selector knob 32 will remain in the selected position until the user intentionally moves the knob to a new position.

Figure 5:
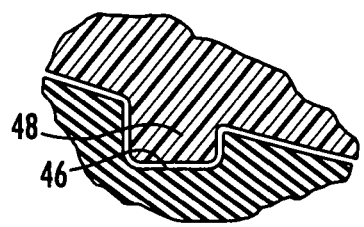
FIG. 5 is an enlarged cross-section showing the manner in which the protrusion located on the underside of the selector knob is received in the arcuate groove of the front panel.

A stop feature is preferably provided to limit rotation of knob 32 in both clockwise and counterclockwise directions. In this embodiment, the stop feature comprises an arcuate groove 46 (FIG. 2) defined in the surface of panel 16. As shown in FIG. 5, groove 46 receives a protrusion 48 located on the bottom of selector knob 32. When protrusion 48 engages the end faces of groove 46, further rotation is prevented. Therefore, the angular range of groove 46 corresponds to the number of function positions through which selector knob 32 must travel.

Figure 4:
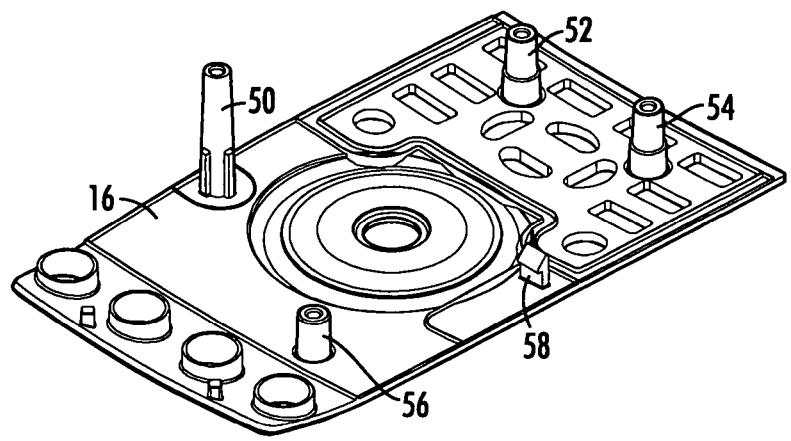
FIG. 4 is a perspective showing the underside of the front panel shown in FIG. 2.

As shown in FIG. 4, one or more bosses may be provided to retain panel 16 in position when the case is assembled. In this embodiment, for example, at least four such bosses are provided (respectively designated 50, 52, 54 and 56). As known to those skilled in the art, the bosses each have a threaded hole into which a threaded fastener is inserted. Being the longest, boss 50 extends all the way through the interior of case 12 for connection to bottom case member 12b. The remaining bosses 52, 54 and 56 may secure the circuit board to top case member 12a. A snap element 58 may also be provided to engage a corresponding slot in top case member 12a, or an additional boss may be provided at this location for additional connection to the circuit board.

Figure 7:
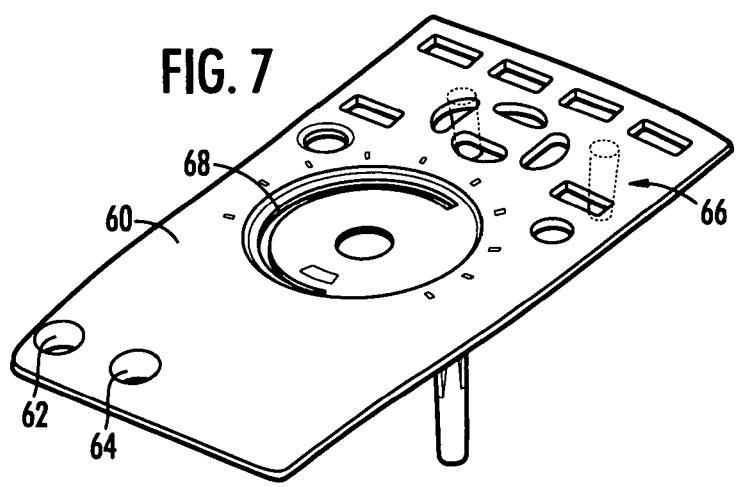
FIG. 7 is a perspective view showing an alternative front panel.

As noted above, the present invention allows several different models of multimeters to utilize the same basic case. Variations in the number of keys, jacks or selector knob positions can be made by substituting a different front panel. This is illustrated in FIG. 7, which shows a front panel 60 that might be utilized for a multimeter in the lower end of the product line. As can be seen, panel 60 has only two jack apertures (as indicated at 62 and 64). In addition, fewer key apertures (collectively 66) are provided. The arcuate groove 68 has a more limited angular range than arcuate groove 46 because the selector knob will travel through fewer function positions.

As one skilled in the art will appreciate, these variations can be accomplished by simply changing inserts in the mold in which the front panels are formed. Specifically, arcuate grooves 46 and 68 may be formed in the same front panel mold by substituting respective inserts when desired. Preferably, the mold inserts will form indicia on the respective panels so that the assembler can easily distinguish between the respective versions. For example, the model number of the multimeter to which a particular panel corresponds can be molded into the panel. Apertures are deleted by simply removing an insert that is positioned in the mold to form the aperture in the molding process. (If jacks are to be deleted, the corresponding socket can be left out of top case member 12a, thus allowing plastic to fill the area where the jack would have been.)

It can thus be seen that the present invention provides a digital multimeter having an improved case panel arrangement. While preferred embodiments of the invention have been shown and described, modifications and variations may be made thereto by those of ordinary skill in the art without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to be limitative of the invention as further described in the appended claims.

What is claimed is:

1. A multimeter comprising:
   a case defining an interior cavity in which components of said multimeter are located, said case having a top portion defining a plurality of first button apertures;
   a rotary selector knob for selecting a multimeter function;
   a separate front panel juxtaposed to said top portion of said case; and
   said front panel having a plurality of second button apertures in respective register with at least some of said first button apertures,
   wherein said top portion of said case defines a recess in which said front panel is received, and
   wherein said top portion of said case is defined by a larger circumferential extent than a circumferential extent of said front panel.

2. A multimeter as set for in claim 1, wherein said front panel includes a stop feature to limit rotational movement of said rotary selector knob.

3. A multimeter as set forth in claim 2, wherein said stop feature comprises an arcuate groove defined in said front panel.

4. A multimeter as set forth in claim 3, wherein said selector knob has a depending protrusion received in said arcuate groove.

5. A multimeter as set forth in claim 1, wherein said case is formed of the top portion and a bottom case member which together define said interior cavity.

6. A multimeter as set forth in claim 5, wherein said top portion includes a unitary molding of transparent polymeric material overmolded with a softer polymeric material.

7. A multimeter as set forth in claim 6, wherein said unitary molding defines said plurality of first button apertures.

8. A multimeter as set forth in claim 7, wherein said unitary molding provides a display window.

9. A multimeter as set forth in claim 1, wherein said top portion of said case defines a greater number of said first button apertures than a number of said second button apertures defined in said front panel.

10. A multimeter as set forth in claim 1, further comprising a flexible keypad located between said top portion of said case and said front panel, said keypad having a plurality of key buttons, said key buttons extending through respective of said second button apertures.

11. A multimeter as set forth in claim 1, further comprising an O-ring seal located about a shaft of said selector knob, said O-ring seal being located between said top portion of said case and said front panel.

12. A multimeter comprising:
   a case defining an interior cavity in which components of said multimeter are located, said case having a top portion defining a panel receiving recess;
   a separate front panel located in said panel receiving recess, said front panel defining a plurality of button apertures;
   a flexible keypad located between said top portion of said case and said front panel, said keypad having a plurality of key buttons, said key buttons extending through respective of said button apertures in said front panel,
   wherein said top portion of said case defines a recess in which said front panel is received, and
   wherein said top portion of said case is defined by a larger circumferential extent than a circumferential extent of said front panel.

* * * * *

UNITED STATES PATENT AND TRADEMARK OFFICE
CERTIFICATE OF CORRECTION

PATENT NO. : 8,466,671 B2  
APPLICATION NO. : 13/031438  
DATED : June 18, 2013  
INVENTOR(S) : J. E. Worones Page 1 of 1

It is certified that error appears in the above-identified patent and that said Letters Patent is hereby corrected as shown below:

In the Claims

| COLUMN | LINE | ERROR |
|---|---|---|
| 6 (Claim 2, line 1) | 6 | "for" should read --fourth-- |

Signed and Sealed this  
Twenty-sixth Day of May, 2015

Michelle K. Lee  
*Director of the United States Patent and Trademark Office*